US007405577B2

(12) United States Patent
Limper et al.

(10) Patent No.: US 7,405,577 B2
(45) Date of Patent: Jul. 29, 2008

(54) APPARATUS AND METHOD FOR DISTINGUISHING BETWEEN FLAT OBJECTS

(75) Inventors: Stephan Limper, Osdorf (DE); Volker Haushahn, Kiel (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 253 days.

(21) Appl. No.: 10/650,051

(22) Filed: Aug. 26, 2003

(65) Prior Publication Data

US 2005/0193807 A1 Sep. 8, 2005

(30) Foreign Application Priority Data

Dec. 18, 2002 (DE) ................................ 102 59 190

(51) Int. Cl.
*G01R 27/08* (2006.01)

(52) U.S. Cl. ........................ 324/693; 324/71.1; 324/707

(58) Field of Classification Search ................. 347/264, 347/262, 199, 200; 324/691, 693, 607, 713, 324/71.1, 722
See application file for complete search history.

(56) References Cited

U.S. PATENT DOCUMENTS

| | | | | |
|---|---|---|---|---|
| 4,230,938 A * | 10/1980 | Margolin et al. | ............ | 234/441 |
| 5,073,791 A * | 12/1991 | Mouri et al. | .................. | 355/27 |
| 5,499,807 A * | 3/1996 | Nakamura et al. | .......... | 271/121 |
| 5,731,830 A * | 3/1998 | Masuda | ...................... | 347/112 |
| 5,899,313 A * | 5/1999 | Pratt | .......................... | 194/206 |
| 6,042,101 A * | 3/2000 | Menard et al. | ........... | 271/10.01 |
| 6,130,702 A | 10/2000 | Ganton | ........................ | 347/264 |
| 6,168,687 B1 * | 1/2001 | Hu et al. | ..................... | 162/198 |
| 6,511,172 B2 * | 1/2003 | Tanno et al. | ................ | 347/104 |
| 6,935,237 B2 * | 8/2005 | Higashi | .................. | 101/463.1 |
| 2001/0030546 A1 * | 10/2001 | Yamada et al. | .............. | 324/691 |
| 2002/0168193 A1 | 11/2002 | Weaver | ........................ | 399/45 |
| 2004/0135590 A1 * | 7/2004 | Quon | ......................... | 324/713 |

* cited by examiner

*Primary Examiner*—Vincent Q. Nguyen
*Assistant Examiner*—Thomas F. Valone
(74) *Attorney, Agent, or Firm*—Laurence A. Greenberg; Werner H. Stemer; Ralph E. Locher

(57) ABSTRACT

An apparatus and a method for detecting the material of a surface of flat objects on a stack, in particular of objects individually separated from one another in the stack by interlayers, preferably of printing plates. The object is to reliably detect the material of the surface of the object that was taken from the stack before it is provided for further processing. The object is achieved by a sensor apparatus that carries out a measurement of the electrical resistance in the region of the object surface to be determined. For this purpose, contact is made between the surface and sensor electrodes, and a measuring current is conducted through the surface. On the basis of the current intensity determined, a distinction is made as to the material of which the object surface is formed.

5 Claims, 5 Drawing Sheets

APPARATUS AND METHOD FOR DISTINGUISHING BETWEEN FLAT OBJECTS

BACKGROUND OF THE INVENTION

Field of the Invention

The invention relates to an apparatus and a method for detecting the material of flat objects on a stack, preferably a stack of printing plates, which are individually separated from one another by interlayers.

For individual processing, flat objects stacked on one another and, in particular, supplied in such a stack first have to be separated and then fed one after another individually into a processing machine. For example, in particular printing plates also have to be inserted individually into a printing plate exposer in order to expose them. This can be done manually. However, for reasons of economy of operation, preference is given to an automatic loading device (loader), which can be connected or attached upstream of a printing plate exposer. A stack of printing plates to be exposed is put into the loading device, and the loading device has a separating apparatus, with which automatic separation and loading of the printing plates is made possible, the printing plates and the interlayers being separated from one another.

The separation operation and loading operation can, however, be disrupted and the subsequent processing can be impaired or prevented by a plurality of objects adhering to one another or by an interlayer, which is intended to separate the object from a following or preceding object in the stack, adhering to the object. In the case of printing plates, paper sheets, for example, are used as interlayers for separation. Interlayers of this type can also not be provided or, in the individual case, can inadvertently be lacking or present in double layers. It can also happen that the printing plates are located inverted on the stack, that is to say not as expected with the layer to be exposed at the top but with the rear of the carrier material at the top. Finally, it is also necessary to be able to detect the case in which the stack has been used, that is to say there is no longer a printing plate present.

Such faults must be detected reliably before the printing plates are loaded into the printing plate exposer, in order to prevent malfunctions of or even damage to the printing plate and the printing plate exposer. According to the prior art, sensors are predominantly used for this purpose which aim a light beam onto the surface of the flat object to be determined and, by measuring the intensity and/or color of the reflected light, determine the characteristics of the flat object, that is to say whether it is an exposure layer of a printing plate, the rear of a printing plate, whether it is a paper interlayer or whether there is no printing plate present at all. However, this measurement method has the disadvantage that it does not function reliably enough for all types of printing plates that are available and are used. There is too great a plethora of printing plates, whose exposure layers have different reflection characteristics. In addition, the reflection characteristics of the paper interlayers used vary to a great extent, depending on the type, color and surface smoothness of the paper used. The sensor device has to be calibrated in accordance with a complicated method for each new printing plate type that comes onto the market or else even when the manufacturer of the printing plates has merely changed the composition of the exposure layer or the color of the paper interlayers. Finally, there is also the risk that parts of the exposure layer will be pre-exposed by the optical sensors.

In U.S. Pat. No. 6,042,101, use is made of a sensor that operates inductively, in order to detect whether a paper interlayer is still resting on a metallic printing plate. The sensor generates a magnetic field, whose change as the sensor is moved closer to the printing plate is measured. When the sensor is resting directly on the printing plate, the result is a different magnetic field change to that when it is still at a short distance from the printing plate because of the paper layer. A conclusion about the presence of a paper interlayer is drawn from this difference.

In U.S. Pat. No. 6,130,702, use is made of a sensor that operates capacitively, in order to detect whether a paper interlayer is still resting on a metallic printing plate. An electrode applied to the printing plate and the printing plate itself functioning as a matching electrode form a capacitor whose capacitance is measured. If a paper interlayer is present, the result is a lower capacitance than without a paper interlayer.

SUMMARY OF THE INVENTION

It is accordingly an object of the invention to provide an apparatus and a method for distinguishing between flat objects that overcome the above-mentioned disadvantages of the prior art devices and methods of this general type, with which, during the separation of flat objects, in particular of printing plates, it is possible to detect reliably the material of the surface of the object that was taken from the stack before it is provided for further processing. In this case, a clear distinction between the various types of material is to be made possible, but the distinction is to be largely independent of the exact composition and of the variations within a type of material.

With the foregoing and other objects in view there is provided, in accordance with the invention, an apparatus for detecting a material of a surface of a flat object on a stack of flat objects. The apparatus includes a sensor apparatus containing a sensor carrier, sensor electronics, and sensor electrodes resting on the surface of the flat object and conducting a measuring current through the surface of the flat object. The sensor carrier supports the sensor electrodes, and the sensor electronics are connected to the sensor electrodes.

The object is achieved by a novel type of sensor apparatus, that is preferably integrated in a device for raising and separating the flat objects from the stack. Depending on the individual distinction made by the sensor apparatus, the further sequence of the processing of the objects is controlled differently.

The sensor apparatus according to the invention achieves the object by measuring the electrical resistance to a high-frequency signal in the region of the object surface to be determined. For this purpose, contact is made between the surface and sensor electrodes and a high-frequency voltage is applied to the electrodes. A measuring current, whose current intensity depends on the electrical resistance of the surface, flows through the surface region between the electrodes. On the basis of the current intensity determined, a distinction is drawn as to the material of which the object surface consists.

In accordance with an added feature of the invention, an electrical resistance in the surface of the flat object is measured with the measuring current.

In accordance with an additional feature of the invention, the sensor electronics contain a frequency generator connected to the sensor electrodes, a rectifier connected to the sensor electrodes, a measurement amplifier connected to the rectifier, comparators connected to the measurement amplifier, and an evaluation unit connected to the comparators.

In accordance with another feature of the invention, the sensor electronics contain a controllable-frequency frequency generator connected to the sensor electrodes, a rectifier connected to the sensor electrodes, a measurement amplifier connected to the rectifier, an analog-digital converter connected to the measurement amplifier, and a control and evaluation unit connected to the analog-digital converter.

In accordance with a further feature of the invention, the sensor electronics has a short-circuit detector connected to the sensor electrodes.

The sensor apparatus detects a surface type of the surface of the flat object as being paper, an exposure layer of a printing plate, metal or 'no object'.

In accordance with another added feature of the invention, a loading device for printing plates is provided, and the sensor apparatus is integrated into the loading device. Optionally, the sensor apparatus is integrated into a lifting device.

Furthermore, the flat objects are individually separated from one another in the stack by interlayers and preferably the flat objects are printing plates.

With the foregoing and other objects in view there is further provided, in accordance with the invention, a method for detecting a material of a surface of a flat object on a stack of flat objects. The method includes using sensor electrodes resting on the surface of the flat object and connected to sensor electronics for conducting a measuring current through the surface of the flat object.

In accordance with an added mode of the invention, there is the step of generating the measuring current with a frequency generator, and the frequency generator applying a high-frequency voltage to the sensor electrodes. The measuring current is used for measuring an electrical resistance of the surface of the flat object. The measuring current is converted into a measuring voltage, and the material forming the surface is determined from a voltage range in which the measuring voltage lies. A frequency of the measuring current can be varied using a controllable frequency generator, and a plurality of measurements at different frequencies is carried out. The measuring voltages determined from the plurality of measurements are evaluated for determining the material of the surface.

Other features which are considered as characteristic for the invention are set forth in the appended claims.

Although the invention is illustrated and described herein as embodied in an apparatus and a method for distinguishing between flat objects, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
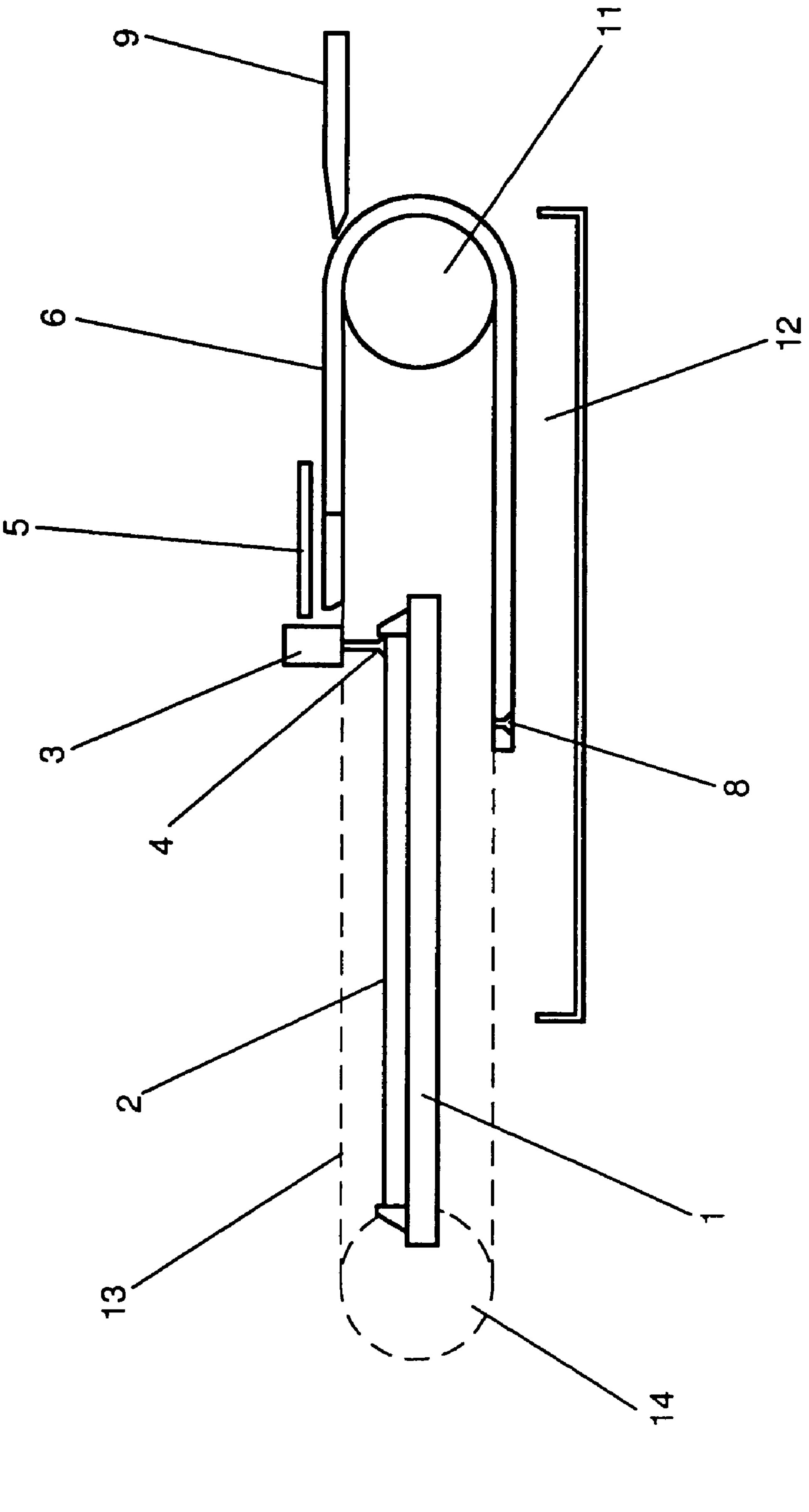
FIG. 1 is a diagrammatic, side-elevational view of a lifting and separating apparatus for printing plates according to the invention.

Referring now to the figures of the drawing in detail and first, particularly, to FIG. 1 thereof, there is shown in schematic form and only in principle, a side view of an exemplary embodiment of an apparatus for separating printing plates from a stack. It being necessary to handle printing plates that have an extremely wide range of formats, thicknesses and coatings and are deposited in a plate stack individually separated from one another by paper interlayers.

The embodiment illustrated in FIG. 1 contains a cassette 1 in which a plate stack 2 is deposited. A respective upper printing plate is to be removed individually from the plate stack 2 and provided for onward transport, for example to be introduced into a printing plate exposer. The interlayer appearing under the respective printing plate removed is likewise to be removed from the plate stack 2 and deposited in an orderly fashion for disposal or for reuse.

In order to raise the marginal, top side of a printing plate or an interlayer from the plate stack 2, a substantially bar-like lifting device 3 with suction elements 4 is provided. In order to support the raised edge of the object lifted by the suction elements 4, a clamp element 5 can come into action for a certain time and engage under the object and clamp it together with the lifting device 3.

As a transport support for the raised object, use is made of a shutter or jalousie 6 which can be moved under the object and on which the lifting device 3 can deposit the object after it has been released by the clamp element 5. The shutter 6 has its own suction elements 8 that fix the deposited object from the underside. The object can be a printing plate or an interlayer or else an interlayer that is still adhering to the underside of the deposited printing plate. A printing plate deposited on the shutter 6 is pushed over a doctor 9, after the suction elements 8 have released it, specifically onto a deposit table, not specifically illustrated, which adjoins the doctor 9 in the same plane.

The shutter 6 is a constituent part of a circulating transport element 13 that runs in a closed loop over deflection rollers 11 and 14. In this case, the shutter 6 can be moved in two directions, namely, as a result of the transport element 13 circulating in the counterclockwise direction, into a holding position for a raised object and, as a result of the transport element 13 circulating in the clockwise direction, in order to transport and discharge a deposited printing plate over the doctor 9 and/or in order to carry along an interlayer attached by suction, in the direction of a paper tray 12.

The movement sequence of the apparatus according to FIG. 1 is illustrated in FIGS. 2A to 2D in various operating phases during the separation of a printing plate 15. Identical elements, as also in the following figures, are designated by the same reference numbers as in FIG. 1, some of the reference numbers having been left out for reasons of clarity.

Figure 2A:
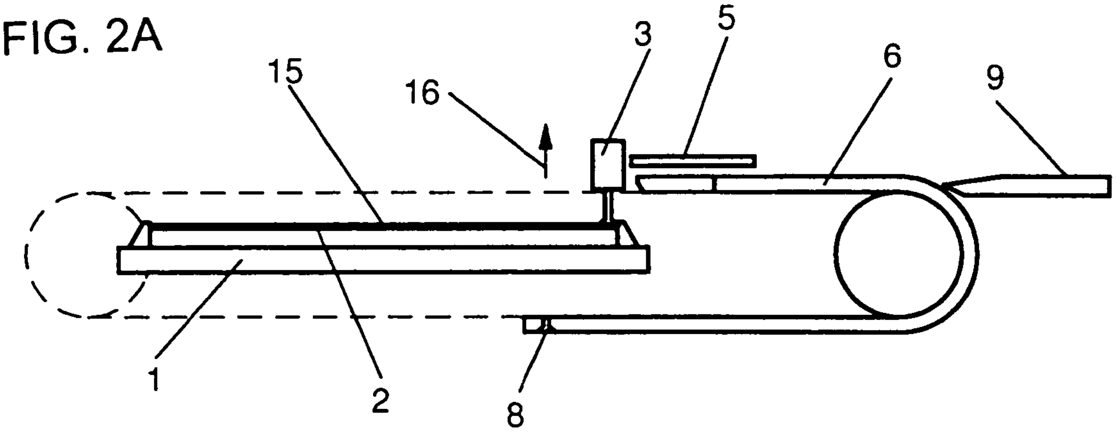
FIGS. 2A to 2D are side-elevational views showing the apparatus according to FIG. 1 during the separation of a printing plate.

In FIG. 2A, the suction elements 4 of the lifting device 3 come into action, grip an edge of the printing plate 15 at the top and lift the edge in the direction of arrow 16.

Figure 2B:
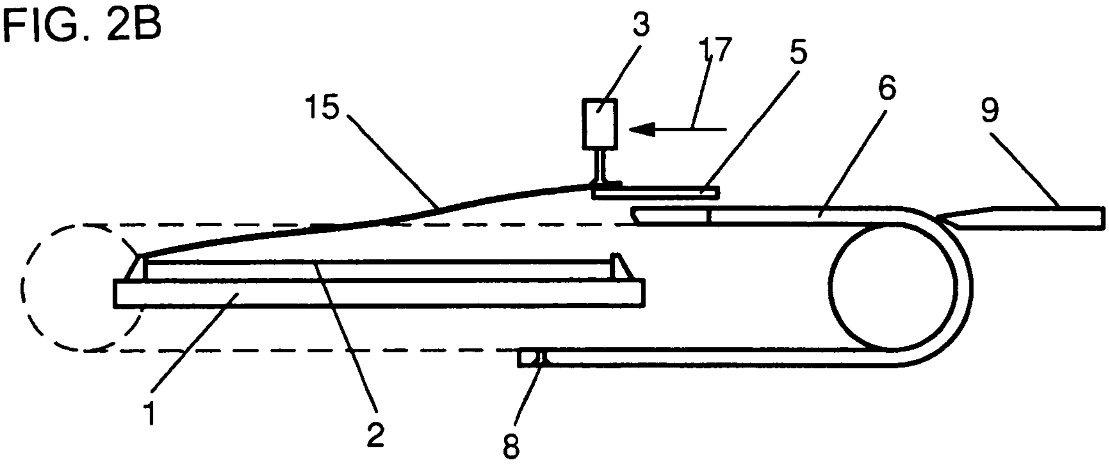

In FIG. 2B, the clamp element 5 moves in the direction of arrow 17 under the raised edge of the printing plate 15 and clamps and supports it.

Figure 2C:
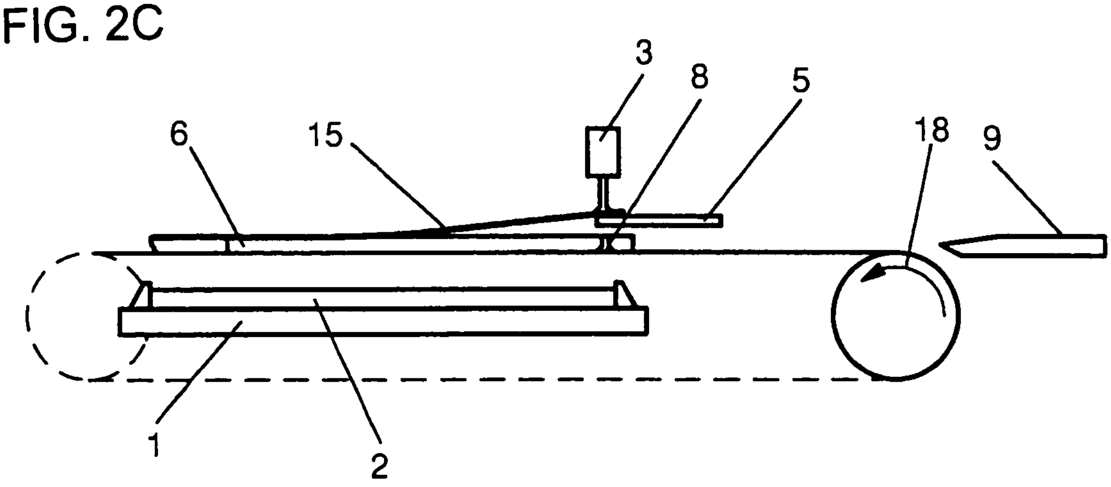

In FIG. 2C, the deflection elements of the transport element 13 rotate in the counterclockwise direction, in the direction of arrow 18, and as a result move the shutter 6, as a transport underlay, under the printing plate 15 which is consequently lifted further and as a whole.

Figure 2D:
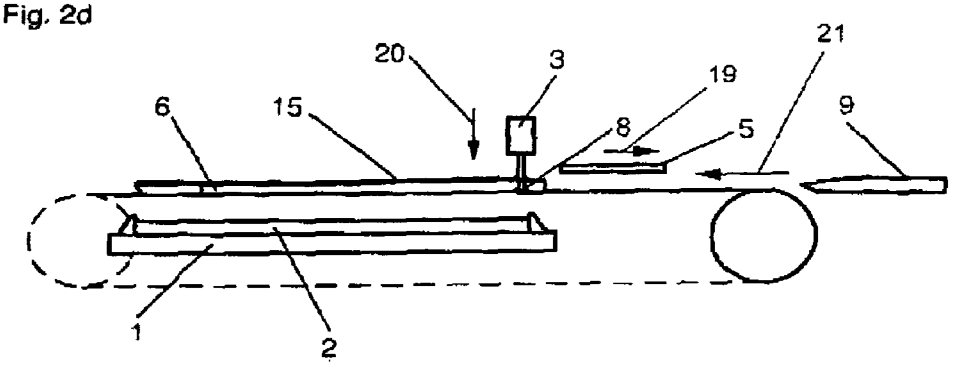

In FIG. 2D, the lifting device 3 lowers the printing plate 15 in the direction of arrow 20 onto the shutter 6 and, at the same time, the clamp element 5 releases the printing plate 15, by moving in the direction of arrow 19. The suction elements 8 of the shutter 6 can also now come into action and attract the printing plate in the direction of the arrow 20 by suction and fix it on the shutter 6. The separated printing plate 15 is then ready for further processing, for example for the transport into a printing plate exposer.

Before the onward transport of the printing plate 15, a check is made with a sensor apparatus according to the invention to see whether a paper interlayer is still lying on the printing plate 15, whether the printing plate 15 is located with the exposure layer or with the rear at the top, or whether a printing plate 15 is present at all.

Figure 3A:
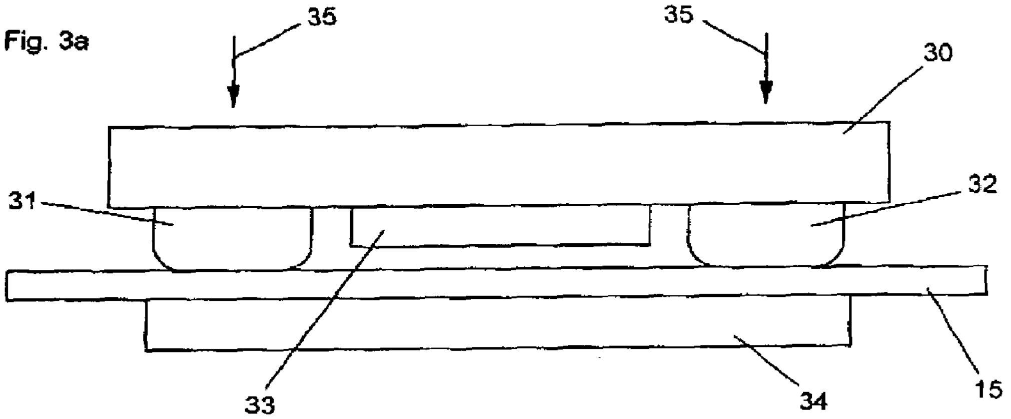
FIG. 3A is a side-elevational view of a sensor apparatus according to the invention.

FIG. 3A shows a sensor apparatus in a view of the front edge of the printing plate 15, that is to say in the direction of the arrow 21 in FIG. 2D. The sensor apparatus contains a bar-shaped sensor carrier 30, to which two sensor electrodes 31, 32 are fitted. The sensor carrier 30 is pressed onto a surface of the printing plate 15 with a defined force in a direction of arrows 35, so that a good electrical contact is produced between the sensor electrodes 31, 32 and a surface of the printing plate 15. At this time, the printing plate 15 is supported by a support surface 34 that, for example, can be integrated into the shutter 6 or into the clamp element 5. However, a separate support surface 34 can also be provided in the transport path of the printing plate 15. Sensor electronics 33 required for the operation of the sensor apparatus are preferably also fitted to the sensor carrier 30. However, the sensor electronics 33 can also be accommodated at any other point on the printing plate loading device and connected to the sensor electrodes 31, 32 by a cable. The sensor apparatus is preferably integrated into the lifting device 3, but the sensor carrier 30 can also be mounted separately at any desired point above the printing plate 15.

Figure 3B:
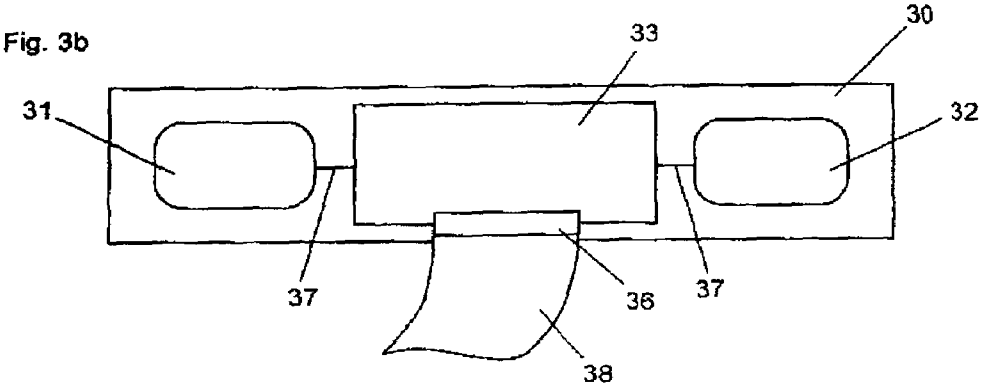
FIG. 3B is a plan view of the sensor apparatus.

FIG. 3B shows the sensor carrier 30 together with the sensor electrodes 31, 32 and the sensor electronics 33 in a view from below. The sensor electrodes 31, 32 are connected to the sensor electronics 33 by leads 37, and the sensor electronics 33 are connected, via a cable plug 36 and a cable 38, to a non-illustrated control system, belonging to the printing plate loading device. The device control system controls the further sequence of the separating and loading operation on the basis of the surface characteristic of the separated printing plate 15 determined by the sensor apparatus.

The functioning of the sensor apparatus is based, according to the invention, on a measurement of an electrical resistance to a high-frequency signal in the region of the surface with which contact is made by the sensor electrodes 31, 32. On the basis of series of measurements, it has been shown that, for the possible material surfaces (paper on a printing plate, exposure layer of the printing plate, carrier material of the printing plate, that is to say its rear, no printing plate), there are resistance ranges which are typical and can be separated from one another, by measuring which the aforementioned types of surface can be distinguished. It is particularly advantageous in this case that the typical resistance ranges are largely independent of the type of interlayer paper or of the exact composition of the exposure layer on the printing plate. It is also characteristic and advantageous for the sensor apparatus according to the invention that contact is made only between the sensor electrodes 31, 32 and the material surface to be determined.

Figure 4:
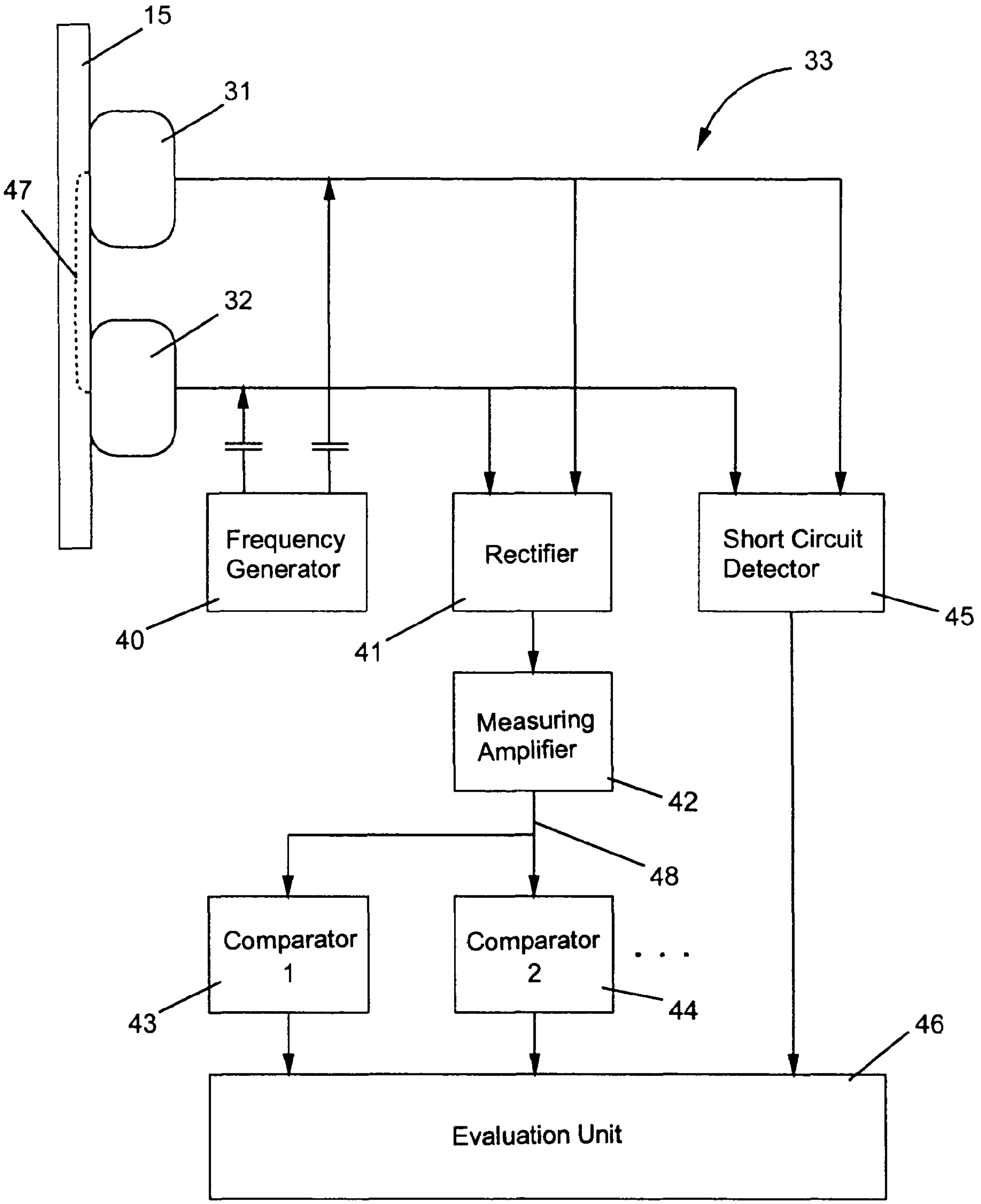
FIG. 4 is a block diagram of sensor electronics.

FIG. 4 shows a block diagram of the sensor electronics 33 in a preferred embodiment. Using a frequency generator 40, a high-frequency voltage is generated, preferably as a periodic square-wave signal and, for example, at a frequency of 33 MHz. A frequency differing from this or a sinusoidal voltage waveform is likewise possible. The high-frequency voltage is applied to the sensor electrodes 31, 32 in the manner of an alternating voltage, a measuring current 47 flowing between the electrodes 31, 32 through the surface region of the printing plate 15, its current intensity depending on the resistance in the surface region. In FIG. 4, the measuring current 47 is indicated by a dashed current path.

Using a rectifier 41 and a following measurement amplifier 42, the current intensity of the measuring current 47 is converted into an equivalent measuring voltage 48, which is led to a plurality of comparators 43, 44. The comparators 43, 44 compare the measuring voltage 48 with voltage ranges which are equivalent to the aforementioned typical resistance ranges for the various material types of the surface with which contact is made by the sensor electrodes 31, 32. If the measuring voltage 48 lies in the voltage range of a comparator, the comparator outputs a signal to an evaluation unit 46. For example, the first comparator 43 outputs an output signal if a paper interlayer is still resting on the printing plate 15, the second comparator 44 outputs an output signal if the sensor electrodes 31, 32 are resting on the exposure layer of the printing plate 15, and so on. The evaluation unit 46 is, for example, in the simplest case, a digital encoder which converts the output signals from the comparators 43, 44 into a bit sequence which is subsequently forwarded to the non-illustrated device control system, belonging to the loading unit.

In the preferred embodiment of the sensor electronics 33, a short-circuit detector 45 is additionally provided, with which it is detected whether the sensor electrodes 31, 32 are making contact with the rear of the printing plate 15 with a metallic carrier material, for example aluminum. Since most by far of the printing plates 15 used in practice have an aluminum carrier, this case will be detected reliably by the short-circuit detector 45. Of course, the short-circuit case can also be detected by a further comparator by using the measuring voltage 48. Likewise, further comparators can be provided, for example in order to detect the rear of printing plates 15 with a nonmetallic carrier material, for example of polyester, or else further materials.

The entire sensor electronics 33 are preferably fed with a supply voltage that is electrically isolated from the rest of the separating and loading unit, in order to minimize the influences of the rest of the electrical device units on the sensor electronics 33. Likewise, the high-frequency signals from the sensor electronics 33 therefore cannot have a detrimental effect on the rest of the device units either.

Figure 5:
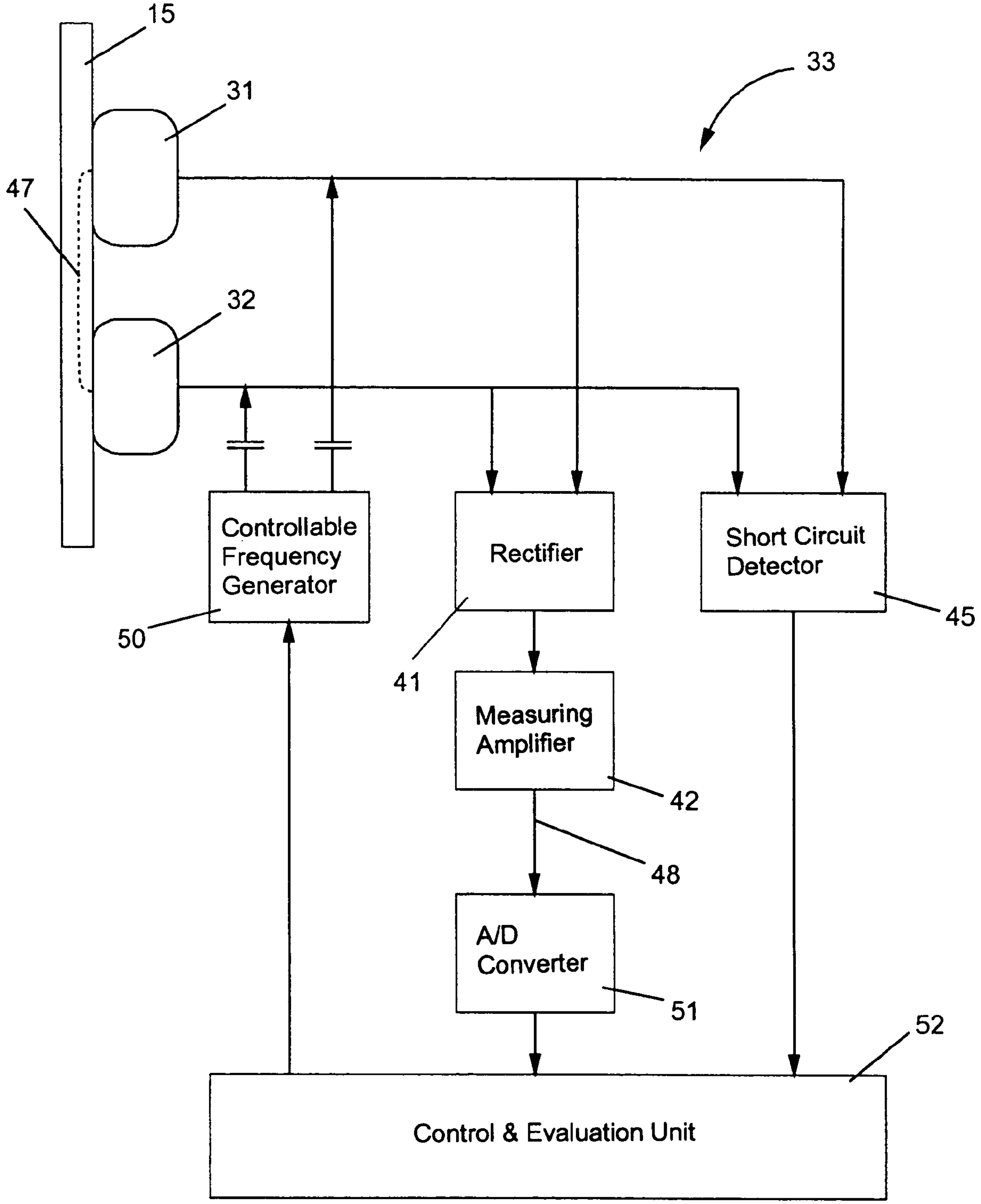
FIG. 5 is a block diagram of an alternative embodiment of the sensor electronics.

FIG. 5 shows a further embodiment of the sensor electronics 33 as a block diagram. Instead of the frequency generator 40, a controllable frequency generator 50 is provided, whose frequency can be set by a control and evaluation unit 52. Instead of the comparators 43, 44, there is an analog-digital converter 51, which converts the measuring voltage 48 into a digital measured value, which is processed by the control and evaluation unit 52. The control and evaluation unit 52 is, for example, a program-controlled unit, in which the measured value ranges of the various surface materials to be distinguished are stored as a function of the frequency of the voltage which is applied to the sensor electrodes 31, 32. If no unique material can be assigned to the determined measured value of a measurement, the controllable frequency generator 50 will be set to a different frequency and a further measurement carried out. Further measured values will be obtained with further variations in the measuring frequency, if appropriate. By the evaluation of the combination of the measured values obtained for various frequencies, the certainty of the correct detection of the surface material is increased. The sensor electronics 33 shown in FIG. 5 are also more flexible in relation to the calibration and setting to new or changed printing plate materials. For this purpose, only the measured value ranges stored in the control and evaluation unit 52 have to be adapted appropriately.

Besides the configuration described previously and shown in FIG. 3A, in which the sensor carrier 30 with the sensor electrodes 31, 32 and the sensor electronics 33 is located above the separated printing plate 15 and is lowered onto the printing plate 15 from above for the purpose of measurement, alternatively or else additionally, a configuration can be chosen in which the sensor apparatus is integrated into the support surface 34. In this case, the sensor apparatus is mounted rotated through 180 degrees in the support surface 34, so that the sensor electrodes 31, 32 point upward and project out of the support surface 34. The printing plate 15 is then pressed onto the sensor electrodes 31, 32 from above for the purpose of measurement, and the material characteristic on the underside of the printing plate 15 is measured. If both configurations are present, both sides of the printing plate 15 can be measured simultaneously or else successively. By comparing the measured values on the two sides of the printing plate 15, the certainty of the material determination can be increased still further.

We claim:

1. A method for detecting a material of a surface of a flat object on a stack of flat objects, the flat object being printing plates, which are separated by interlayers, the method which comprises the steps of:

using sensor electrodes resting on the surface of the flat object and connected to sensor electronics for conducting a measuring current through the surface of the flat object;

varying a frequency of the measuring current using a controllable frequency generator;

carrying out a plurality of measurements at different frequencies;

distinguishing a surface material by depending on the frequency of the voltage which is applied to the sensor electrodes;

evaluating measuring voltages determined from the plurality of measurements to detect the material of the surface; and distinguishing between an exposure layer of the printing plates, the interlayers, and a rear of the printing plates before providing the printing plates for further processing.

2. The method according to claim 1, which further comprises generating the measuring current with a frequency generator, and the frequency generator applying a high-frequency voltage to the sensor electrodes.

3. The method according to claim 1, which further comprises using the measuring current for measuring an electrical resistance of the surface of the flat object.

4. The method according to claim 1, which further comprises:

converting the measuring current into a measuring voltage; and recognizing the material forming the surface from a voltage range in which the measuring voltage lies.

5. The method according to claim 1, which further comprises determining the surface to be a surface type selected from the group consisting of paper, an exposure layer of a printing plate, metal, and 'no object'.

* * * * *